United States Patent
Bolam

[19]

[11] Patent Number: 6,075,357
[45] Date of Patent: Jun. 13, 2000

[54] ARRANGEMENT FOR CONNECTING A UTILITY METER TO METER BASE USING CURRENT BLADES

[75] Inventor: Charles Bolam, Lafayette, Ind.

[73] Assignee: Siemens Power Transmission & Distribution, Inc., Wendell, N.C.

[21] Appl. No.: 09/004,591

[22] Filed: Jan. 8, 1998

[51] Int. Cl.[7] .............................. G01R 1/04; G01R 1/06; G01R 1/00; G01R 11/24; H01R 13/64

[52] U.S. Cl. .......................... 324/156; 324/110; 324/149; 361/668; 439/167

[58] Field of Search .................................... 324/156, 149, 324/110; 361/668–670; 437/167, 517

[56] References Cited

U.S. PATENT DOCUMENTS

2,363,345 11/1944 MacGahan .
3,742,355 6/1973 Darling .
4,034,290 7/1977 Warren .

*Primary Examiner*—Walter E. Snow

[57] ABSTRACT

An arrangement for electrically connecting an electrical utility revenue meter to a meter base includes at least two current blades that have a width that is less than the standard predefined current blade width. The meter base has one of first and second vertical alignment mechanisms, said first and second vertical alignment mechanisms cooperating with electrical utility revenue meters having current blades of a standard predefined width for effecting proper registration of the electrical utility meter with respect to the meter base. The arrangement of the present invention includes at least first, second, third and fourth current blades. At least two current blades each have a first edge aligned in registration with the first vertical alignment mechanism, and at least two current blades each have a second edge aligned in registration with the second vertical alignment mechanism.

9 Claims, 6 Drawing Sheets

ARRANGEMENT FOR CONNECTING A UTILITY METER TO METER BASE USING CURRENT BLADES

FIELD OF THE INVENTION

The present invention relates generally to electrical utility revenue meters, and in particular, electrical utility revenue meters having current contact blades.

BACKGROUND OF THE INVENTION

Electrical utility revenue meters, or simply revenue meters, are typically attached to an electrical system being metered through a meter-mounting device. A commonly available meter-mounting device is a meter base that includes a plurality of current jaws that are electrically connected to the power lines of the facility being metered. The meter includes current blades that are received by the current jaws to provide the electrical connection.

The current jaws also serve to align the meter in proper physical registration with the meter base. Meters have to be carefully aligned with meter bases for several reasons. For example, proper alignment ensures an accurate fit which, in turn, provides a seal to protect the interior of the meter and meter device from the elements and weather. In addition, proper alignment ensures a secure fit of a meter security seal to the meter. A meter security seal is a mechanical device that prevents removal of the meter from the meter base without a special tool. The purpose of the meter security seal is to prevent tampering. Several known types of security seals exist, and all require a relatively accurate fit between the meter and the meter base.

The current jaws assist in aligning the revenue meter with the base by forcing the current blades into a particular position, similar to a plug into a socket. The current jaws, however, only provide alignment along one dimension. Specifically, the jaws contact both sides of the current blades and thus serve to align the meter in a side to side relationship. Absent other alignment features, however, the current blades could typically be disposed at any vertical location within jaws. The term "vertical" as used herein, refers to the vertical direction from the perspective of viewing the revenue meter face.

To align meters in proper vertical registration with a meter base, additional meter blade alignment mechanisms must be used. Such vertical alignment mechanisms include blade guides and flash shields, both of which are well known in the art. Blade guides may either be inner blade guides or outer blade guides.

Blade guides are disposed adjacent to and substantially abutting the meter base jaws. In particular, each blade guide is positioned to engage an edge of a standard current blade when the current blade is inserted into the jaws. Accordingly, the jaws and the blade guides guide the meter into proper registration as the current blades are inserted into the jaws. All of the meter blade alignment mechanisms, including the jaws, are designed to cooperate with ANSI standard electrical utility meter current blades. Current blades have a predefined standard thickness of 0.093 inches and a predefined width of 0.760 inches, and have predefined and standard alignment and positioning.

While meter base jaws contact both sides of the current blades to secure the meter within the meter base, the blade guides typically only contact one of the edges of the current blades. In particular, outer blade guides contact only the outer edge of each of the current blades, and the inner blade guides contact only the inner edge of each of the current blades. The outer blade guides provide an upward guiding force onto the bottom current blades, and a downward guiding force onto the top-most blades. The opposing guiding forces on top and bottom blades force the meter into a substantially precise vertical alignment with the meter base. Similarly, the inner blade guides contact only the inner edge of the current blades, thereby providing a downward guiding force on the bottom blades and an upward guiding force on the top blades to align the meter. Such opposing forces urge the meter into a substantially precise vertical alignment.

The choice of which vertical alignment mechanism is used in a particular base or facility is typically controlled by either the electrical construction contractor or the utility. In any event, the meter manufacturer typically does not control the type of meter base, but must produce a meter that is compatible with meter bases using any of the standard vertical alignment mechanisms. The provision of meters compatible with the various vertical alignment mechanisms has historically not been an issue because all of the meter base vertical alignment mechanisms were designed to be compatible with current blades of standard alignment, thickness and width. As a result, meter manufacturers did not need to be concerned with compatibility with the various vertical alignment mechanisms if they employed standard current blades One drawback, however, to providing meters having current blades of a standard alignment, thickness and width is that current blades of such standard dimensions significantly affect the material cost of the meter. In particular, current blades are typically constructed of copper, or another conductive metal, and the standard dimensions are relatively large and require a significant amount of metal. As a result, standard current blades represent a substantial portion of the overall meter manufacturing costs.

Moreover, current blades are typically integrally formed with current coils that are located within the meter. To simplify manufacturing costs, the current blades and current coil often have substantially the same thickness and width. As a result, the relatively large dimensions of the standard current blades will dictate relatively large dimensions in the current coil, thereby further increasing costs.

For example, the current coil and current blades are commonly formed by stamping or cutting an elongated straight piece of copper (or other conductive material) having the width and thickness of the current blades. The ends of the elongated piece of copper are then bent to for a "C" shape. The ends of the "C" protrude outward the meter and form the current blades. In such configurations, the large thickness and height requirements of the current blades also defined the current coil thickness and height.

Prior art methods attempted to reduce costs by reducing the width of the current coil. However, to achieve compatibility with meter bases having any of the known vertical alignment mechanisms, the current blades were required to maintain the standard width. Accordingly, several methods of generating current coils were developed in which the body of the current coil had less width than the current blades. One method included attaching two current blades to a pre-formed current coil of lesser width. While such a design can reduce the material costs of the current coil/current blade arrangement, that design undesirably introduces additional manufacturing steps. Moreover, such an arrangement does not decrease the material costs specifically associated with the current blades themselves.

A need, therefore, exists for a meter having a current blade configuration that reduces material costs associated with the current blades and current coils of the meter without increasing the complexity of manufacture of the meter.

SUMMARY OF THE INVENTION

The present invention fulfills the above need, as well as others, by providing a meter having current blades having a width that is less than the predefined standard current blade width. Such current blades are also arranged such that at least two blades have edges that align in substantial registration with a first vertical blade alignment mechanism in a meter base and such that at least two blades have edges that align in substantial registration with a second vertical blade alignment mechanism in a meter base. Because at least two blades have edges that align in registration with each of the first and second vertical blade alignment mechanisms, the meter can have current blades of smaller dimensions that are nevertheless compatible with most if not all meter bases.

An exemplary embodiment of the present invention includes an arrangement for electrically connecting an electrical utility revenue meter to a meter base, the meter base having one of first and second vertical alignment mechanism, said first and second vertical alignment mechanism cooperating with electrical utility revenue meters having current blades of a standard predefined width for effecting proper registration of the electrical utility meter with respect to the meter base. The arrangement of the present invention includes at least first, second, third and fourth current blades. At least two current blades each have a first edge aligned in registration with the first vertical alignment mechanism, and at least two current blades each have a second edge aligned in registration with the second vertical alignment mechanism. Finally, at least two current blades have a width that is less than the standard predefined width.

Because at least two current blades have a width that is less than the standard predefined width, material costs are reduced, and the current blades may be easily and integrally formed with a current coil of reduced dimensions.

The above features and advantaged, as well as others, will become more readily apparent to those of ordinary skill in the art by reference to the following detailed description and accompanying drawings.

DETAILED DESCRIPTION

Figure 1:
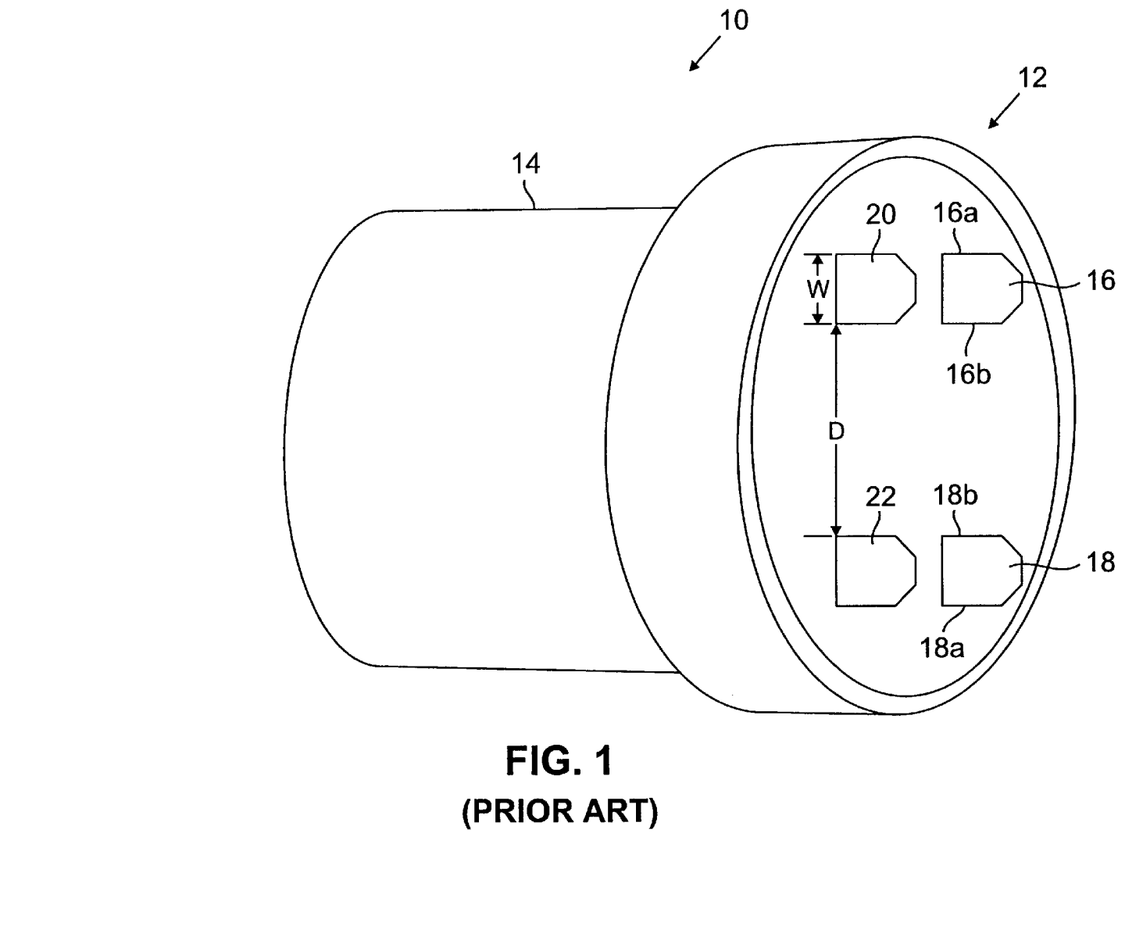
FIG. 1 shows a perspective view of a prior art meter having current blades of standard size and configuration.

FIG. 1 shows a perspective view of a prior art meter 10 having current blades of standard size and configuration.

Specifically, the meter 10 includes a housing 14 which encapsulates metering circuitry, not shown, a meter base interface 12, and first, second, third and fourth current blades 16, 18, 20, and 22 respectively. The current blades 16, 18, 20, and 22 connect the metering circuitry to the power lines of a facility being metered, not shown, through a meter base ( See FIGS. 2 and 3).

The size and configuration of the current blades 16, 18, 20 and 22 in a United States implementation are defined be a regulatory body such as ANSI. The standard size and configuration ensures compatibility between meters and meter bases of different manufacturing origins. In the exemplary prior art meter shown herein, the meter 10 is a single phase meter for residential use. However, standard meter blade configurations exist for a plurality of meter types. The current blades 16, 18, 20 and 22 each have a thickness of 0.093 inches, (not depicted in FIG. 1) that is in accordance with ANSI standard C12.10.

The first current blade 16 also has a width W that extend vertically and is defined by an outer edge 16a and an inner edge 16b. The second current blade 18 is disposed in vertical alignment with, but spaced apart front the first current blade 16. The second current blade 18 also has a width W that extends vertically and is defined by an outer edge 18a and inner edge 18b. The width W of the first and second current blades 16 and 18 is defined by standard, and in the example discussed herein, is 0.760 inches.

The first current blade inner edge 16b is spaced apart from the second current blade inner edge 18b by vertical distance D. Thus, for example, the first current blade outer edge 16a is spaced apart from the second current blade outer edge 18a by a vertical distance of D+2 W.

The third current blade 20 is horizontally displaced from the first current blade 16, but otherwise has the same dimensions, orientation, and vertical location. The fourth current blade 22 is horizontally displaced from the second current blade 18 by the same distance as the horizontal distance between the third current blade 20 and the first current blade 16. The fourth current blade 22 otherwise has the same dimensions, orientation, and vertical location as the second current blade 18. The third and fourth current blades 20 and 22 are thus vertically spaced apart by the same dimension as the first and second current blades 16 and 18.

Figure 2:
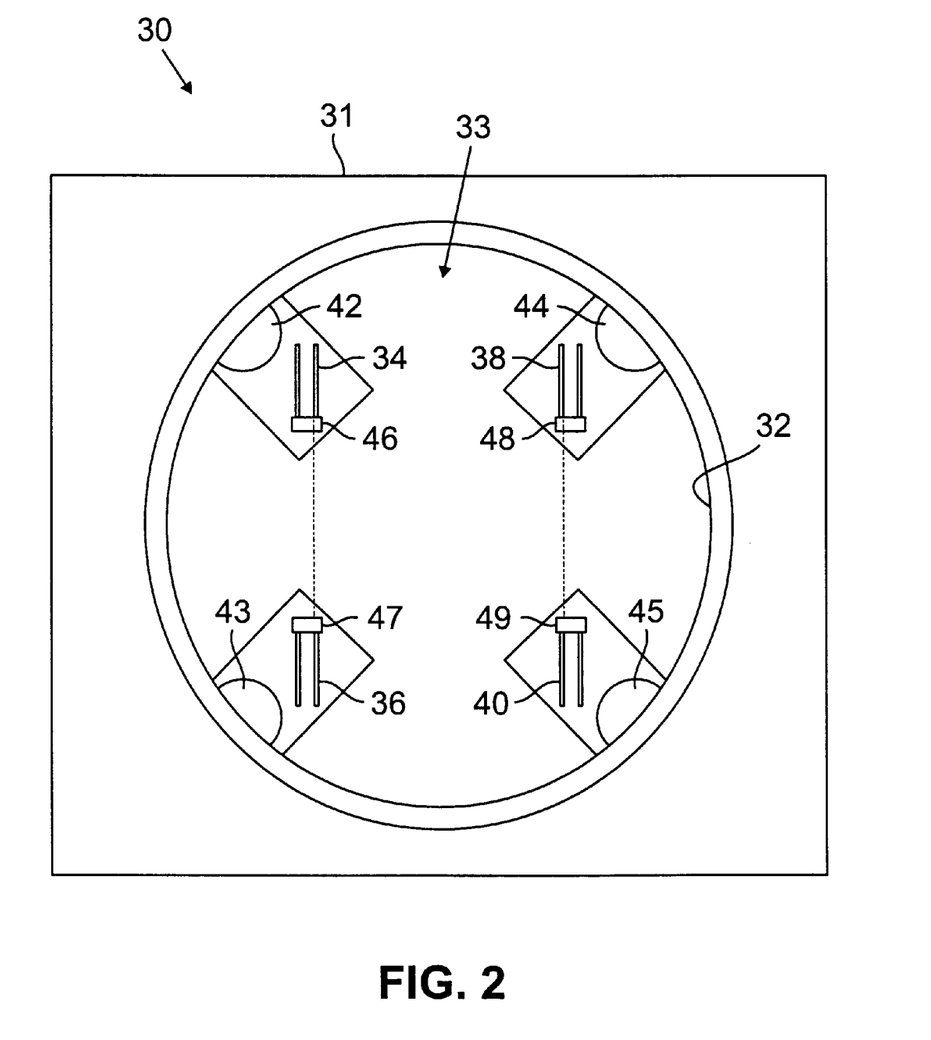
FIG. 2 shows an top elevational view of a first meter base having a first vertical alignment mechanism for use in connection with a cooperating meter.
Figure 3:
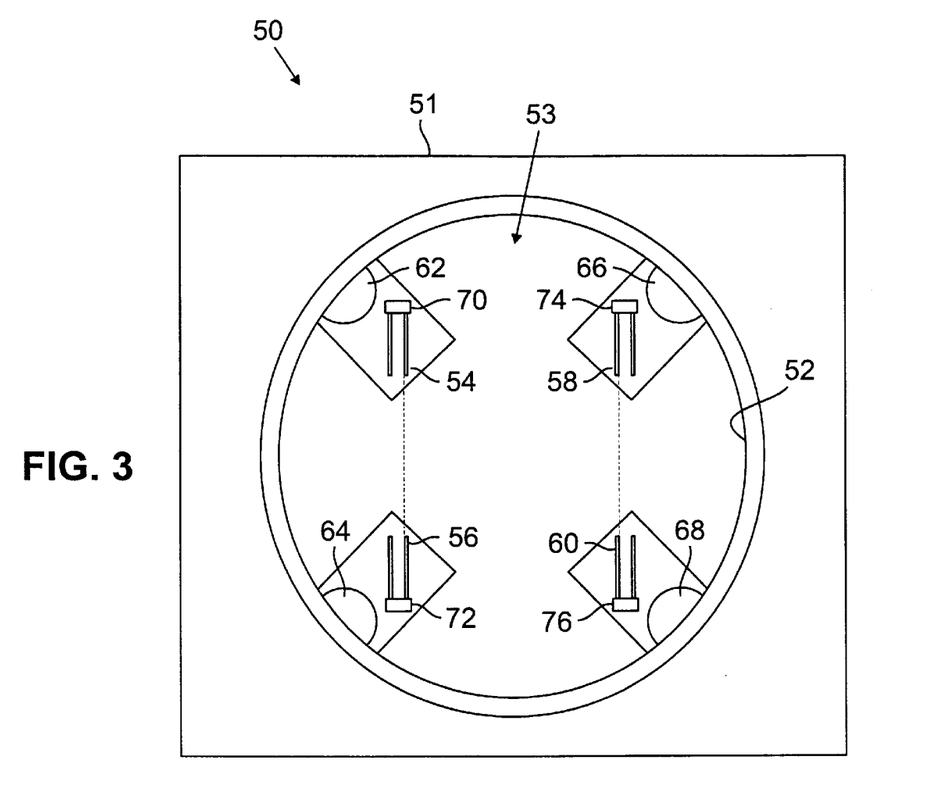
FIG. 3 shows an top elevational view of a second meter base having a second vertical alignment mechanism for use in connection with a cooperating meter.

The meter 10 is configured to be received by a cooperating meter base. FIGS. 2 and 3 illustrate first and second meter bases, 30 and 50, respectively, which are examples of ordinary standard meter bases. As will be discussed below, the first meter base 10 of FIG. 1 has a first vertical alignment mechanism and the second meter base 50 of FIG. 2 has a second vertical alignment mechanism consisting of a set of inner blade guides. The second meter base 50 includes a second vertical alignment mechanism consisting of a set of outer blade guides. Meter bases having such first and second vertical alignment mechanism are experiencing widespread use in the metering industry. Ideally, a meter should be compatible for use with either vertical alignment mechanism.

In particular FIG. 2 shown an top elevational view of a first meter base 30 for use in connection with a cooperating meter such as the meter 10 of FIG. 1. The first meter base 30 includes a base cover 31 which forms an enclosure with the sides of the first meter base 30, not visible in this view. The base cover 31 includes a circular opening 32 for receiving a cooperating meter into an interior 33 of the first meter base 30. The interior 33 of the first meter base 30 includes first, second, third and fourth current jaws 34, 36, 38 and 40, respectively, which are electrically connected to, respectively, first, second, third, and fourth wire terminals 42, 43, 44 and 45. The first, second, third, and fourth wire terminals, which are only partially visible through the circular opening 32, are typically screw terminals that receive conductors from the load being metered, not shown. Meter bases such as the first meter base 30 are well known to those of ordinary skill in the art.

The first meter base 30 further includes a first vertical alignment mechanism comprising a first inner blade guide 46, a second inner blade guide 47, a third inner blade guide 48, and a fourth inner blade guide 49.

In accordance with ANSI standards, the current jaws 34, 36, 38 and 40 have a predefined size and configuration. For example, the current jaws 34, 36, 38 and 40 are configured to receive first, second, third and fourth current blades of a standard meter, for example, current blades 16, 18 20 and 22 of FIG. 1, wherein each current blade has a standard thickness of 0.093 inches. In the exemplary first meter base 30 illustrated herein, the current jaws 34, 36, 38, and 40 also have a width of approximately 0.760 inches to match the width of the standard current blase on the cooperation meter. The jaws 34, 36, 38 and 40 are carefully aligned with respect to the circular opening 32 to insure that the jaws force the blades into a position in which the circular meter aligns in substantial horizontal registration with the circular opening 32.

The exemplary meter 10 described herein is a standard residential type meter, and the first meter base 30 is designed for use with such a meter. Accordingly, in the exemplary meter base 30, the first current jaw 34 is in vertical alignment with, but spaced apart from, the second current jaw 36. The innermost points of the current jaws 34 and 36 are spaced apart by a distance D, and the outermost points of the current jaws 34 and 36 are spaced apart by a distance of D+2 W. It will be noted, however, that the current jaws 34 and 36 need not have a width of W, but in any event must be vertically spaced to receive the current blades of a standard residential meter.

Similarly, the third current jaw 38 is in vertical alignment with, but spaced apart from, the fourth current jaw 40. In the exemplary first meter base 30 discussed herein, the innermost points of the third current jaw 38 and fourth current jaw 40 are also spaced apart by a distance D, and their outermost points are spaced apart by a distance D+2 W.

The first inner blade guide 46 is positioned proximate the first current jaw 34 to engage an edge of a standard current blade of a cooperating meter. For example, the first inner blade guide 46 is positioned to engage the inner edge 16b of the first current blade 16 of the meter 10 of FIG. 1. The second inner blade guide 47 is likewise positioned proximate to the second current jaw 36 to engage an edge of a second, vertically displaced standard current blade in a cooperating meter. The second inner blade guide 47 is specifically positioned to exert a force in the opposite direction of the force exerted by the first inner blade guide 46 on the first standard current blade. For example, the second inner blade guide 47 is positioned to engage the inner edge 18b of the second current blade 18 in the meter 10 of FIG. 1.

The third inner blade guide 48 is positioned proximate the third current jaw 38 to engage an edge of a third standard current blade in cooperating meter. For example, the third inner blade guide 48 is positioned to engage the inner edge of the third current blade 20 in the meter 10 of FIG. 1. The fourth inner blade guide 49 is positioned proximate to the fourth current jaw 40 to engage an edge of a fourth standard current blade, which is vertically displaced from the third current blade, of the cooperating meter. The fourth inner blade guide 49 is specifically positioned to exert a forced in the opposite direction of the force exerted by the third inner blade guide 48 on the third standard current blade. For example, the fourth inner blade guide 49 is positioned to engage the inner edge 22b of the fourth current blade 22 in the meter 10 of FIG. 1.

The opposing forces exerted by inner blade guides 46 and 47 on the first and second current blades 16 and 18, respectively, as well as the forces exerted by the inner blade guides 48 and 49 on the third and fourth current blades 20 and 22, respectively, urge and guide the cooperating meter into a predefined vertical alignment with respect to the first meter base 30. The relatively tight fit of the current haws 34, 36, 38 and 40 also guides the meter into predefined horizontal alignment with respect to the first meter base 20. Thus, for example, the combined forces of the meter jaws 34, 36, 38 and 40 and inner blade guides 46, 47, 48 and 49 in the first meter base 30 on the current blades 16, 18, 20 and 22, respectively, of the meter 10 of FIG. 1, cooperate to force the meter 10 into substantial registration with the first meter base 30. In particular, the meter base interface surface 12 of the meter 10 of FIG. 3 is in substantial registration and contact with the circular opening 32.

FIG. 3 shows an top elevational view of a second meter base 50 for use in connection with a cooperating meter such as the meter 10 of FIG. 1. The second meter base 50 has substantially the same configuration as the first meter base 30 of FIG. 1 except for the vertical alignment mechanism. In particular, the second meter base 50 includes a base cover 51 which forms an enclosure with the sides of the second meter base 50, not visible in this view. The base cover 51 includes a circular opening 52 for receiving a cooperating meter into an interior 53 of the second meter base 50. The interior 53 includes first, second, third and fourth current jaws 54, 56, 58 and 60, respectively, which are electrically connected to, respectively, first, second, third, and fourth wire terminals 62, 64, 66 and 68. The second meter base 50 further includes a second vertical alignment mechanism comprising a first outer blade guide 70, a second outer blade guide 72, a third outer blade guide 74, and a fourth outer blade guide 76.

In accordance with ANSI standards, the current jaws 54, 56, 58 and 60 have a predefined size configuration. The current jaws 54, 56, 58 and 60 are configured to received corresponding standard current blades, each having a thickness of 0.093 inches. In the exemplary second meter base 50 illustrated herein, each of the current jaws 54, 56, 58, and 60 also has a width of approximately 0.760 inches to match the height of the standard current blade on the cooperating meter. In the exemplary second meter base 50, the current jaws 54, 56, 58 and 60 have substantially the same configuration as the current jaws 34, 36, 38, and 40 of FIG. 2.

The first outer blade guide 70 is positioned proximate the first current jaw 54 to engage an edge of a first standard current blade in a cooperating meter. For example, the first outer blade guide 70 is positioned to engage the outer edge 16a of the first current blade 16 of the meter 10 of FIG. 1. The second outer blade guide 72 is positioned proximate to the second current jaw 56 to engage an edge of a second, vertically displaced standard current blade in a cooperating meter. The second outer blade guide 72 is specifically positioned to exert a force in the opposite direction of the force exerted by the first outer blade guide 72 is positioned to engage the outer edge 18a of the second current blade 18 in the meter 10 of FIG. 3.

The third outer blade guide 74 is positioned proximate the third current jaw 58 in a manner analogous to the first outer blade guide 20. Similarly, the fourth outer blade guide 76 is positioned proximate the fourth current jaw 60 in a manner analogous to the positioned of the second outer blade guide 72.

The opposing forces exerted by outer blade guides 70 and 72 on the first and second current blades 16 and 18, respectively, as well as the forces exerted by the outer blade guides 74 and 76 on the third and fourth current blades 20 and 22, respectively, urge and guide the cooperating mater into a predefined vertical alignment with respect to the second meter base 50. The opposing forces exerted by outer blade guides 70, 72, 74 and 76 are thus analogous to the forces exerted by the inner blade guides 46, 47, 48 and 49 of FIG. 2. However, the forces exerted by the outer blade guides 70, 72, 74, and 76 are inward, as opposed to outward.

As discussed above, the meter 10 is compatible with both the first meter base 30 and the second meter base 50. Specifically, the current blades 16, 18, 20 and 22 each have a standard, predefined height, which will cooperate with the first vertical alignment mechanism having inner blade guides, and an second vertical alignment mechanism having outer blade guides. However, as outlined above, there is a cost penalty associated with using current blades having standard width. The cost penalty arises from the significant amount of copper needed to formulate such blades. That cost penalty is increased if the associated current coils of the meter have the same width as the current blades.

Figure 4:
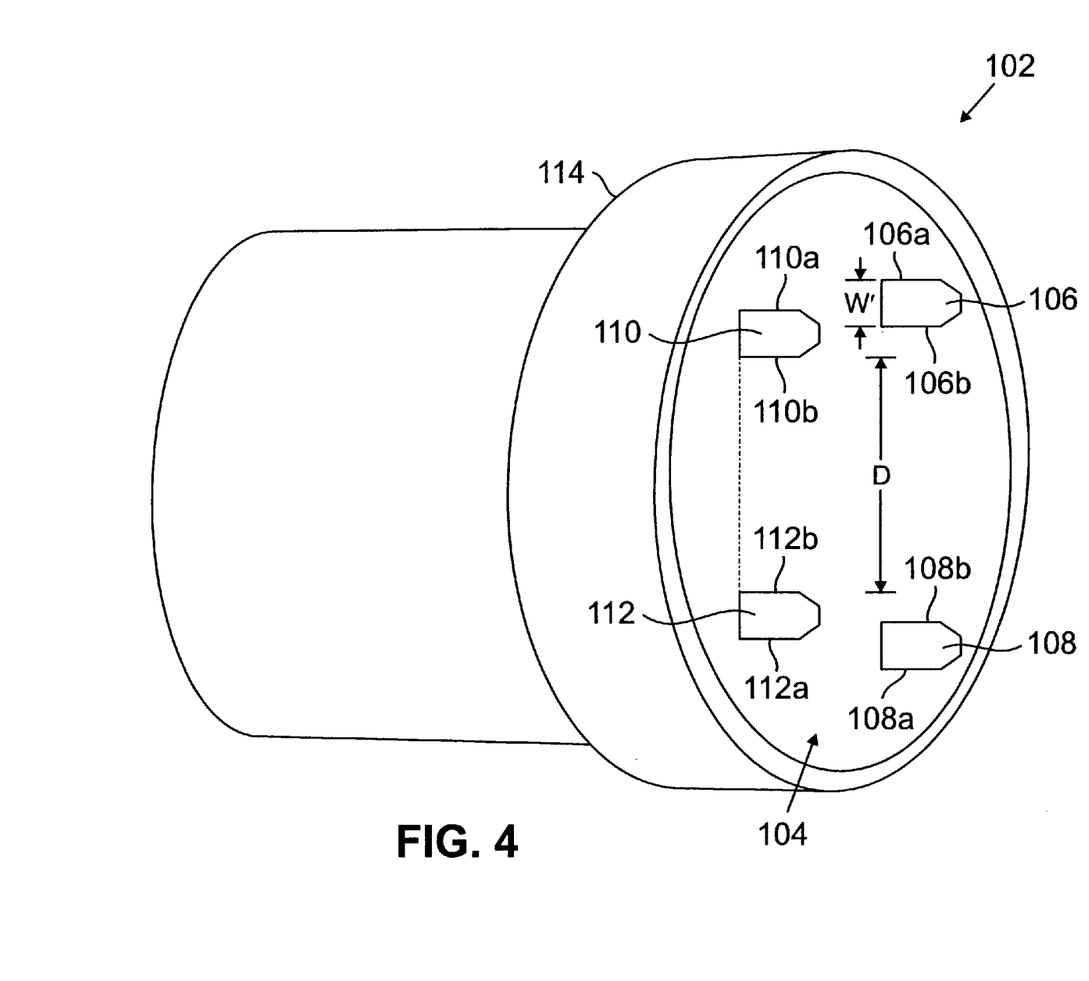
FIG. 4 shows a meter having an arrangement for connecting the meter to a meter base in accordance with a first embodiment the present invention.

FIG. 4 shows a meter 102 having an arrangement 104 for connecting the meter 102 to a meter base in accordance with a first embodiment the present invention. In contrast to the prior art, the arrangement includes at least two current blades that have a width that is substantially less that the standard current blade width, thereby reducing material costs. In addition, the arrangement 104 connects the meter 102 to a meter base having either of a first and second vertical current blade alignment mechanisms. Thus, for example, the arrangement 104 operably connects the meter 102 to either of the first meter base 30 (FIG. 2) or second meter base 50 (FIG. 3).

According to the first embodiment of the present invention, the arrangement includes first, second, third and fourth current blades 106, 108, 110 and 112, each having a width W' that is less that the standard current blade width W (see, for example, the first current blade 16 of FIG. 1). In the exemplary embodiment described herein, the width W' is equal to 0.438 inches.

To achieve compatibility with both the first vertical alignment mechanism, which includes inner blade guides, and the second vertical alignment mechanism, which includes outer blade guides without being of standard current blade width, the current blades 106, 108, 110 and 112 are advantageously positioned such that at least two current blades align in registration with inner blade guides and at least two current blades have edges align in registration with outer blade guides. More specifically, at least two current blades align such that at least two standard inner blade guides exert opposing forced onto the at least two current blade guides, thereby urging the meter 102 into vertical registration with the corresponding meter base. Likewise, at least two current blades align such that at least two standard outer blade guides exert opposing forced onto the at least two current blades, thereby urging the meter 102 into vertical registration with the corresponding meter base.

To this end, the current blades 106, 108, 110, and 112 are arranged in the general configuration described above in connection with FIG. 1. Specifically, the first and second current blades, 106 and 107, respectively, are vertically aligned and spaced apart, while the third and fourth current blades 110 and 112, respectively, are vertically aligned spaced apart.

According to a first embodiment of the present invention, the width W' of the first current blade 106 is defined by an outer edge 106*a* and an inner edge 106*b*. The outer edge 106*a* is positioned to align in registration with a standard outer blade guide, such as the first outer blade guide 70 of FIG. 3, when the meter 102 is in proper registration with the meter base. Because the width W' is less than the standard width W, the inner edge 106*b* does not align in registration with a standard inner blade guide, such as the inner blade guide 46 of FIG. 2.

Similarly, the width W' of the second current blade 108 is defined by an outer edge 108*a*, which aligns in registration with a corresponding standard outer blade guide, and an inner edge 108*b*, which does not align in registration with a corresponding standard inner blade guide.

The width W' of the third current blade 110 also is defined by an outer edge 110*a* and an inner edge 110*b*. The inner edge 110*b* is positioned to align in registration with a standard inner blade guide, such as the first inner blade guide 46 of FIG. 2, when the meter 102 is in proper registration with the meter base. The outer edge 110*a* does not align in registration with a standard outer blade guide, such as the outer blade guide 70 of FIG. 2. Similarly, the width of W' of the fourth current blade 112 is defined by an inner edge 112*b*, which aligns in registration with a corresponding standard inner blade guide, and an outer edge 112*a*, which does not align in registration with a corresponding standard outer blade guide.

When the meter 102 is installed into a meter base having the first standard vertical alignment mechanism, such as the first meter base 30 of FIG. 2, the inner edge 110*b* of the third current blade 110 and the inner edge 112*b* of the fourth current blade 112 operate in conjunction with the first standard vertical alignment mechanism to position the meter 102 in proper registration within the meter base.

By way of example, the insertion of the meter 102 into the first meter base 20 of FIG. 2 is discussed below, Reference is made to both FIGS. 2 and 4 for the following discussion. It is noted that upon installation of the meter 102, the first, second, third and fourth current blades 106, 108, 110 and 112 engage the first, second, third, and fourth current jaws 34, 36, 38, and 40, respectively, thereby providing the appropriate electrical contacts between the first meter base 30 and the meter 102.

For vertical registration of the meter 102, the inner edge 110*b* of the third current blade 110 engages the third inner blade guide 48 of the first meter base 30. Likewise, the inner edge 112*b* of the fourth current blade 112 engages the fourth inner blade guide 49 of the first meter base 30. The third and fourth inner blade guides 48 and 49 exert opposing forces on the third and fourth current blades 110 and 112, respectively. Those opposing forces urge the meter 102 in proper vertical registration with the first meter base 30. The jaws 34, 36, 38, and 40 furthermore exert a spring action grip force that urges the current blades 106, 108, 110 and 112, respectively, into proper horizontal registration with the first meter base 30.

By contrast, when the meter 102 is installed into a meter base having the second standard vertical alignment mechanism, such as the second meter base 50 of FIG. 3, the outer edge 106*a* of the first current blade 106 and the outer edge 108*a* of the second current blade 108 operate in conjunction with the second standard vertical alignment mechanism to position the meter 102 in proper vertical registration with the meter base.

By way of example, the insertion of the meter 102 into the second meter base 50 of FIG. 3 is discussed below. Reference is made to both FIGS. 3 and 4 for the following discussion. As before, the first, second, third, and fourth current blades 106, 108, 110 and 112 engage the first, second, third and fourth current jaws 54, 56, 58 and 60 respectively, to provide the appropriate electrical contacts between the meter base 50 and the meter 102.

For vertical registration of the meter 102, the outer edge 106a of the first current blade 106 engages the first outer blade guide 70 of the second meter base 50. Likewise, the outer edge 108a of the second current blade 108 engages the second outer blade guide 72 of the second meter base 50. The first and second outer blade guides 70 and 72 exert opposing forces on the first and second current blades 106 and 108, respectively. Those opposing forces urge the meter 102 in proper registration with the second meter base 50. The current jaws 54, 56, 58 and 60, operate in a manner similar to that of the current jaws 34, 36, 38 and 40 of FIG. 2 to urge the meter 102 in proper horizontal registration with the second meter base 50.

As a result, the meter 102 may be used in conjunction with meter bases having either the first vertical alignment mechanism, outer blade guides, or the second vertical alignment mechanism, inner blade guides, and has current blades of less than standard width. The use of current blades of less than standard width reduces the material cost of the meter 102 by reducing the amount of material consumed by the blades. In a preferred embodiment, the current blades of the present invention are formed integrally with two current coils.

Figure 5:
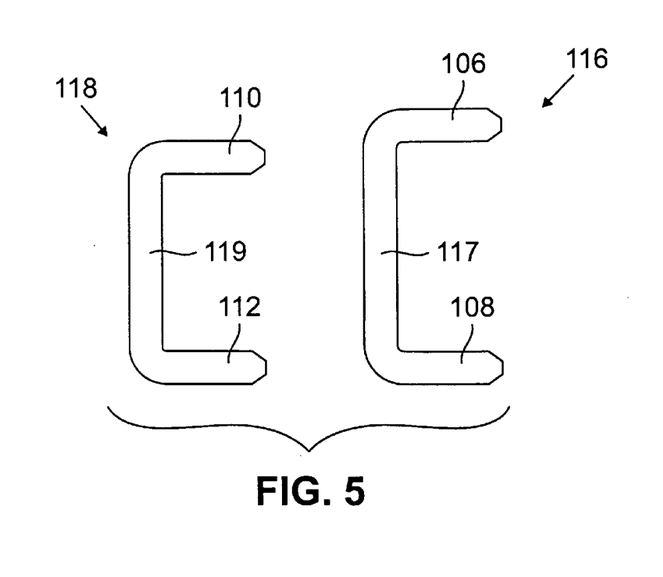
FIG. 5 shows a first and second current coils that include current blades of the arrangement of FIG. 4.

In particular, FIG. 5 shows first and second current coils 116 and 118, respectively, which are suitable for use in an embodiment of the meter 102 of FIG. 4 that consists of a electronic revenue meter. An electronic revenue meter measures energy consumption by generating measurement signals from the actual voltage and current on the power lines, and then digitizing the measurement signals. The digitized measurement signals are then processed by digital circuits to generate energy consumption information. Examples of suitable circuitry for use in electronic revenue meter may be found in U.S. patent application Ser. No. 08/690,973, filed Aug. 1, 1996, which is assigned to the assignee of the present invention and incorporated herein by reference.

In general, the current coils 116 and 118 provide the power line voltage and current level to the interior of the meter 102, at which point measurement signals may be developed therefrom.

The first current coil 116 has a body 117 interposed between the first current blade 106 and the second current blade 108. In a first embodiment, the first current coil 116 comprises a C-shaped piece of conductive material stamped or cut from a sheet of material, not shown, which has a thickness corresponding to the standard current blade thickness. The first current coil 116 is first stamped or punched as a straight, flat piece of material. The first and second current blades 106 and 108 are then formed by bending the flat piece of material to for the C-shaped structure. Alternatively, the first current coil 116 may be punched or stamped from a blank in a C-shaped, thereby eliminating the bending step.

Similarly, the second current coil 118 has a body 119 interposed between the third current blade 110 and the fourth current blade 112, and is preferably formed in the same manner as the current coil 116. In the embodiment described herein, the body 119 has a length that is less than the body 117 of the first current coil 116.

In another embodiment, the first and second current coils 116 and 118 may have a three dimensional shape such as that illustrated shown in U.S. patent application Ser. No. 08/862,844, filed May 23, 1997, which is assigned to the assignee of the present invention and incorporated herein by reference. The three dimensional shaped current coils may also be formed by stamping a flat piece of metal having a uniform width and then bending the stamped metal to form the appropriately shaped coil.

It is noted that the current coils 116 and 118 are relatively easy to manufacture because the current blades 106, 108, 110, and 112 have the same width and thickness as the rest of each respective current coil. In particular, no extra steps other than perhaps bending are required to generate the current blades apart from the remainder of the current coil. Accordingly, the arrangement 104 for connecting the meter 102 of FIG. 4 to a meter base facilitates the use of current coil and blade structures that require a reduced amount of material without increasing the complexity of manufacture. Specifically, the current coils may have a relatively narrow width, i.e., one that is less than the width of a standard current blade, and still have current blades at the end of each coil that are of the same width as the rest of the current coil. By contrast, prior art current coils that had a similarly narrow width had to use additional manufacturing procedures to formulate or affix current blades that had the standard width, which exceeded the width of the rest of the coil.

Figure 6:
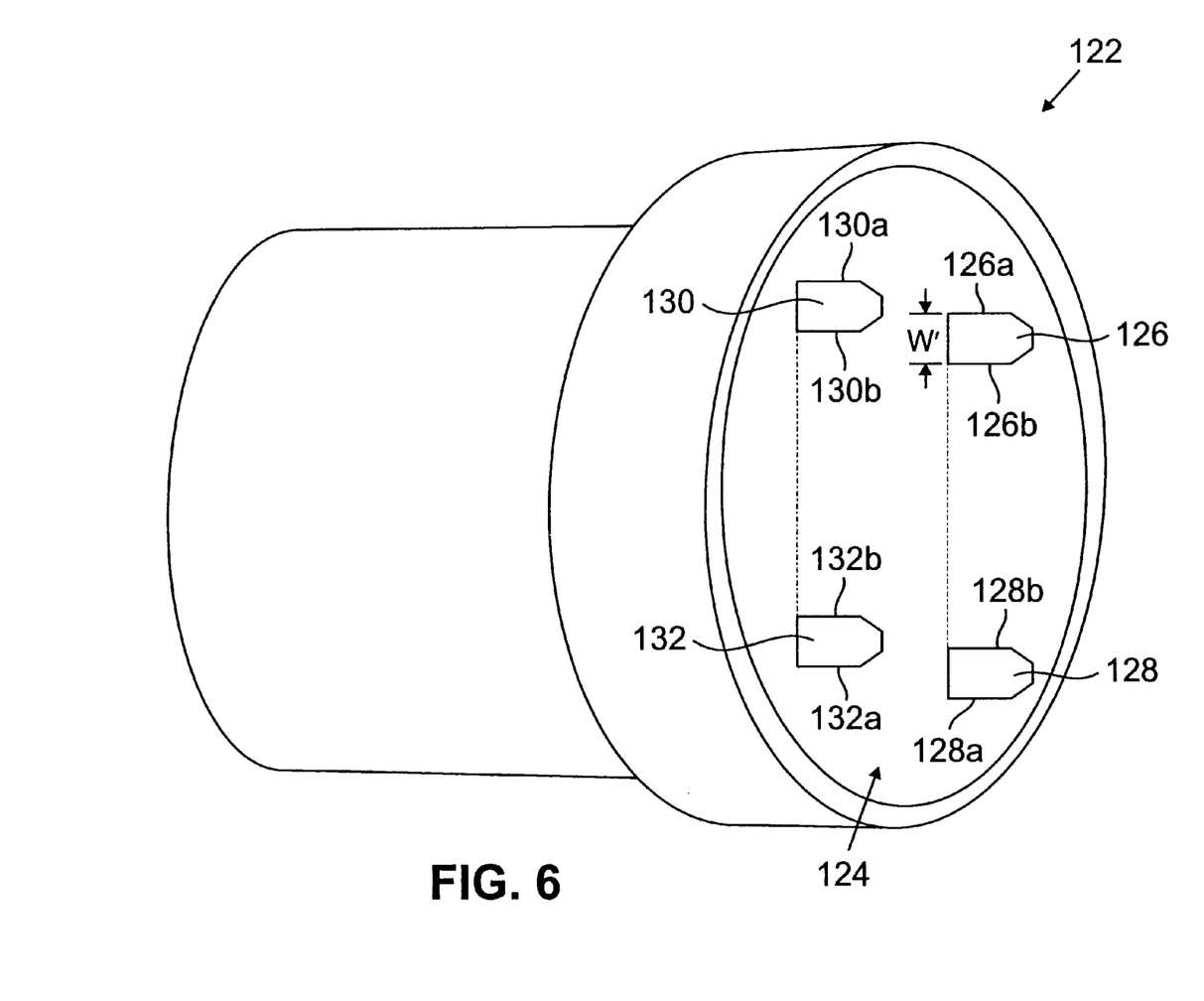
FIG. 6 shows a meter having an arrangement for connecting the meter to a meter base in accordance with a second embodiment of the present invention.

FIG. 6 shows a meter 122 having an arrangement 124 for connecting the meter 122 to a meter base in accordance with a second embodiment of the present invention. The meter 122 of FIG. 6 uses and alternative alignment of current blades that is compatible for use with meter bases having either a first alignment mechanism or a second alignment mechanism.

According to the second embodiment of the present invention illustrated in FIG. 6, the meter 122 includes first, second, third and fourth current blades 126, 128, 130 and 132, respectively, each having a width W' that is less that the standard current blade width W ( see, for example, the first current blade 16 of FIG. 1). The width W' may suitably be 0.438 inches.

Similar to the first embodiment, the current blades 126, 128, 130, and 132 are advantageously positioned such that at least two current blades align in registration with inner blade guides of one type of cooperating meter base and at least two current blades have edges that align in registration with outer blade guides of another type of cooperating meter base.

In general, the current blades 126, 128, 130, and 132 are arranged in manner analogous to that described above in connection with FIG. 1. Specifically, the first and second current blades, 126 and 128, respectively, are vertically aligned and spaced apart, while the third and fourth current blades 130 and 132, respectively, are vertically aligned and spaced apart.

The width W' of the first current blade 126 is defined by an outer edge 126a and an inner edge 126b. The inner edge 126b is positioned to align in registration with a standard inner blade guide, such as the first inner blade guide 46 of FIG. 2, when the meter 122 is in proper registration with the meter base. The outer edge 126a typically does not align in registration with a standard outer blade guide, such as the outer blade guide 70 of FIG. 3. Similarly, the width W' of the second current blade 128 is defined by an outer edge 128a, which aligns in registration with a corresponding standard outer blade guide, and an inner edge 128b, which typically does not align in registration with a corresponding standard inner blade guide.

The width W' of the third current blade 130 also is defined by an outer edge 130a and inner edge 130b. The outer edge 130a is positioned to align in registration with a standard outer blade guide when the meter 102 is in proper registration with the meter base. The inner edge 130b typically does not align in registration with a standard inner blade guide. Similarly, the width W' of the fourth current blade 132 is defined by an inner edge 132b, which aligns in registration with a corresponding standard inner blade guide, and an outer edge 132a, which typically does not align in registration with a corresponding standard outer blade guide.

When the meter 122 is installed into a meter base having the first standard vertical alignment mechanism, such as the meter base 30 of FIG. 2, the inner edge 126b of the first current blade 126 and the inner edge 132b of the fourth current blade 132 operate in conjunction with the first vertical alignment mechanism to position the meter 122 in proper registration with the meter base.

By contrast, when the meter 122 is installed to a meter base having the second vertical alignment mechanism, such as the meter base 50 of FIG. 3, the outer edge 130a of the third current blade 130 and the outer edge 128a of the second current blade 128 operate in conjunction with the second vertical alignment mechanism to position the meter 122 in proper registration with the meter base.

As a result, the meter 122, which incorporated the arrangement 124 in accordance with the second embodiment of the present invention, may be used in conjunction with meter bases having either the first vertical alignment mechanism, i.e. inner blade guides, or the second vertical alignment mechanism, i.e. outer blade guides, and has current blades of less than standard width.

In addition to providing cost advantages discussed above in connection with the embodiment illustrated in FIG. 4, the arrangement 124 provides further advantages associated with the vertical spacing of the current blades.

As discussed above, the current blades of the present invention are preferably integrally formed with current coils of the meter. In particular, the first current blade 126 and the second current blade 128 are integrally formed with a first current coil, and the third current blade 130 and the fourth current blade 132 are integrally formed with a second current coil. One consequence of the arrangement 124 of FIG. 6 and discussed above is that the spacing between the first current blade 126 and the second current blade 128 is substantially the same as the spacing between the third current blade 130 and the fourth current blade 132. Because the spacing between the blades that make up the first current coil is substantially the same as the spacing between the current blades of the second current coil, the same current coil design may be used for both current coils. The use of a single design for both current coils of the meter provides further cost savings by reducing inventory and tracking requirement otherwise associated with having two components of different design, such as those discussed above in connection with FIGS. 4 and 5.

Figure 7:
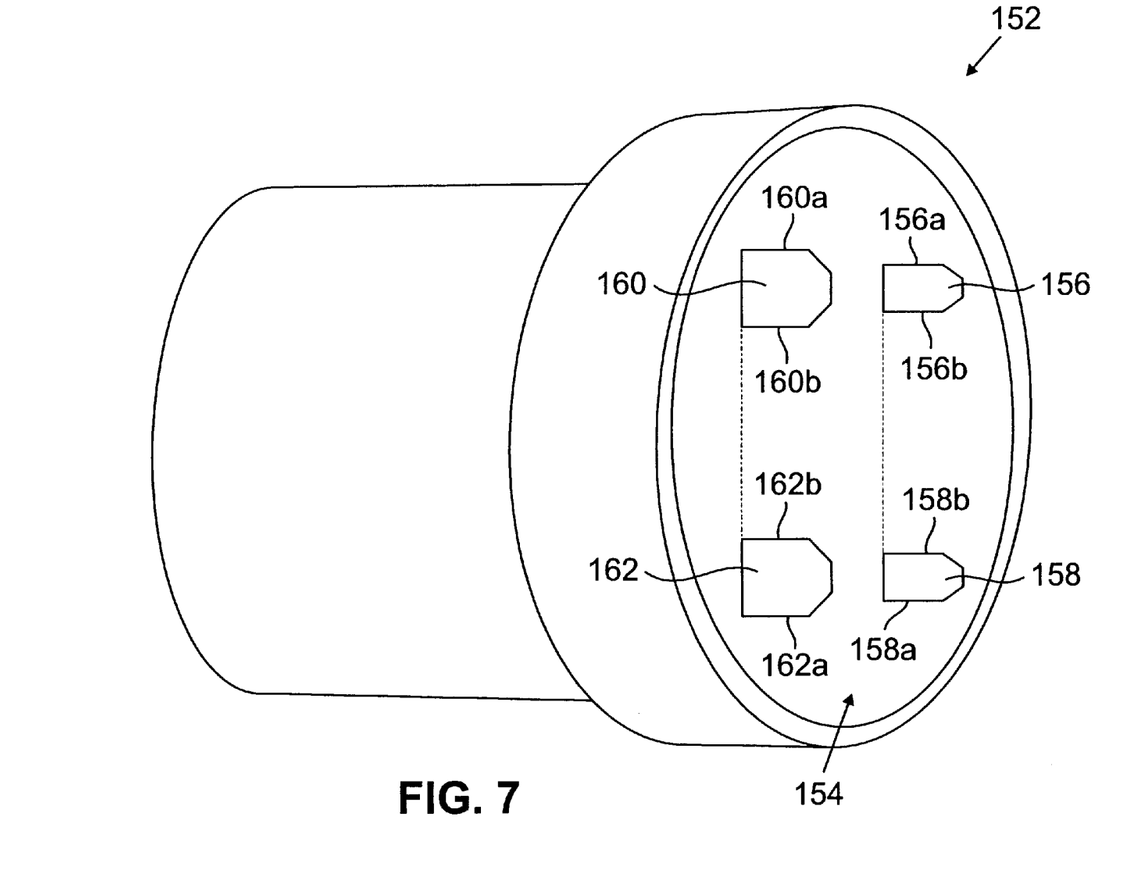
FIG. 7 shows a meter having an arrangement for connecting the meter to a meter base in accordance with a third embodiment of the present invention.

FIG. 7 shows a meter 152 having an arrangement 154 for connecting the meter 152 to a meter base in accordance with a third embodiment of the present invention. Like the arrangements 104 and 124 of FIGS. 4 and 6, respectively, the arrangement 154 connects the meter 152 to a meter base having one of a first and second vertical current blade alignment mechanisms. Thus, for example, the arrangement 154 operably connects the meter 152 to either of the first meter base 30 (FIG. 1) or second meter base 50 (FIG. 2). According to the third embodiment of the present invention, the arrangement 154 includes first and second current blades 156 and 158, respectively, each having a width W' that is less than the standard current blade width W, and third and fourth current blades 160 and 162, each having a width that is substantially equal to the standard current blade width W.

The third and fourth current blades 160 and 162, respectively, serve to urge the meter 152 in substantial registration with a meter base having either inner blade guides or a meter having outer blade guides. To this end, the third and fourth current blade guides 160 and 162, respectively, operate in the same manner as the current blades of the prior art meter illustrated in FIG. 1. In contrast to the prior art, however, the first and second current blades 156 and 158, respectively, have a width that is less than the standard width, which provides some of the savings associated with the use of smaller current blades. Because the third and fourth current blades 160 and 162, respectively, cooperate with either inner or outer blade guides to achieve proper registration of the meter 154 with respect to the meter base, the first and second current blades 156 and 158, respectively, need not be positioned to engage the blade guides of either type.

Thus, the third embodiment of the present invention as incorporated into the meter 152 provided some of the advantages of using blade guides of less than standard width by using at least two blade guides that are of standard width. It is noted, however, that the embodiments of FIGS. 4 and 6 provide additional economies associated with having all of the blade guides being of less than standard height.

It will be appreciated that the above embodiments are merely illustrative, and that those of ordinary skill in the art may readily devise their own implementations that incorporate the features and advantages of the present invention and fall within the spirit and scope thereof. For example, the discussion of meters having four current blades is merely illustrative. The principles of using current blades of less than standard width may readily be incorporated to meters having more current blades, such as those associated with polyphase electrical service. As long as at least two blades have edges that will cooperate with inner blade guides to align the meter in proper registration with the meter base and at least two blades have edges that will cooperate with outer blade guides to align the meter in proper registration with the meter base, the meter will be compatible for use with meter bases having both types of blade guides.

It will further be noted that a meter manufactured in accordance with the present invention is not limited to use with meter bases having either inner blade guides or outer blade guides. Such a meter would be compatible with other vertical blade alignment mechanism, such as flash shields and the like.

We claim:

1. In an electrical utility revenue meter having a plurality of current blades, an arrangement for electrically connecting the electrical utility revenue meter to a meter base, the meter base having one of a first and second vertical alignment mechanisms, said first and second vertical alignment mechanisms cooperating with electrical utility revenue meters having current blades of a standard predefined width for proper registration of the electrical utility meter with respect to the meter base, the arrangement comprising:

at least first, second, third and fourth current blades, wherein at least two current blades each have a first edge aligned in registration with the first vertical alignment mechanism, at least two current blades each have a second edge aligned in registration with the second vertical alignment mechanism, and at least two current blades have a width less than the standard predefined width.

2. The arrangement of claim 1 further comprising a first current coil integrally formed with the first and second current blades and a second current coil integrally formed with the third and fourth current blades.

3. The arrangement of claim 1 wherein at least the first and second current blades have edges aligned in registration with the first vertical alignment mechanism and at least the third and fourth current blades have edges aligned in registration with the second vertical alignment mechanism.

4. The arrangement of claim 3 wherein the first, second, third and fourth blades each have a width less than the predefined standard width.

5. The arrangement of claim 4 further comprising a first current coil integrally formed with the first and second current blades and a second current coil integrally formed with the third and fourth current blades.

6. The arrangement of claim 5 wherein the first current coil is substantially the same as the second current coil.

7. The arrangement of claim 1 wherein the first blade and second blade each have a width less than the predefined standard width, and the third blade has a first edge aligned in registration with the first vertical alignment mechanism and a second edge aligned in registration with the second vertical alignment mechanism.

8. The arrangement of claim 5 wherein the second current blade has a first edge aligned in registration with a first vertical alignment mechanism and a second edge aligned in registration with the second vertical alignment mechanism.

9. In an electrical utility revenue meter having a plurality of current blades, each of the plurality of current blades having an inner edge and an outer edge, an arrangement for electrically connecting the electrical utility revenue meter to a meter base, the meter base having one of first and second current blade alignment mechanisms, the first vertical alignment mechanism operable to engage the outer edges of the current blades of a cooperating electrical utility revenue meter having current blades of a standard predefined width, the second vertical alignment mechanism operable to engage the inner edges of the current blades of a cooperating electrical utility revenue meter having current blades of a standard predefined width, the arrangement comprising at least two current blades having inner edges aligned in registration with a cooperating first outer vertical alignment mechanism and at least two current blades having outer edges aligned in registration with a cooperating second vertical alignment mechanism, and wherein at least two current blades have at least one edge aligned out of registration with either of the cooperating first or second vertical blade alignment mechanism.

* * * * *